(12) United States Patent
Frederick

(10) Patent No.: US 7,248,508 B1
(45) Date of Patent: Jul. 24, 2007

(54) DATA RETENTION IN A SEMICONDUCTOR MEMORY

(75) Inventor: Marlin Frederick, Cedar Park, TX (US)

(73) Assignee: ARM Limited, Cambridge (GB)

( * ) Notice: Subject to any disclaimer, the term of this patent is extended or adjusted under 35 U.S.C. 154(b) by 10 days.

(21) Appl. No.: 11/329,396

(22) Filed: Jan. 11, 2006

(51) Int. Cl.
*G11C 11/40* (2006.01)

(52) U.S. Cl. ............................ 365/189.06; 365/154
(58) Field of Classification Search ............... 365/154
See application file for complete search history.

(56) References Cited

U.S. PATENT DOCUMENTS

| | | | | |
|---|---|---|---|---|
| 4,507,759 A | * | 3/1985 | Yasui et al. ............... | 365/154 |
| 4,618,945 A | * | 10/1986 | Sakurai et al. ........ | 365/230.06 |
| 4,654,826 A | * | 3/1987 | Yamanouchi et al. .. | 365/189.05 |
| 5,301,147 A | * | 4/1994 | Guo et al. ............... | 365/154 |
| 5,463,585 A | * | 10/1995 | Sanada ..................... | 365/201 |
| 5,544,097 A | * | 8/1996 | McClure et al. ......... | 365/154 |
| 5,581,500 A | * | 12/1996 | D'Souza ................... | 365/156 |
| 6,011,713 A | * | 1/2000 | Yamane et al. .......... | 365/156 |

\* cited by examiner

*Primary Examiner*—Tan T. Nguyen
(74) *Attorney, Agent, or Firm*—Nixon & Vanderhye P.C.

(57) ABSTRACT

The application discloses a semiconductor memory storage device comprising: a data retention portion comprising latches; a peripheral portion comprising read and write logic; and a power switching device wherein said peripheral portion is operable to be powered by a periphery voltage difference; said data retention portion is operable to be powered by a data retention voltage difference said data retention voltage difference being different to said periphery voltage difference; and in response to a write request signal to write to at least one of said latches output from said peripheral portion to said data retention portion by said write logic, said power switching device is operable to reduce a voltage difference across said at least one of said latches such that a data signal output from said peripheral portion and having a voltage level determined by said periphery voltage difference is able to write to said at least one of said latches.

16 Claims, 5 Drawing Sheets

DATA RETENTION IN A SEMICONDUCTOR MEMORY

BACKGROUND OF THE INVENTION

1. Field of the Invention

This invention relates to the field of data processing systems. More particularly, this invention relates to the field of semiconductor memories.

2. Description of the Prior Art

In many circuits, particularly those that run off remote power supplies such as batteries, it is important to keep the power consumption of the circuits low. As well as addressing the issue of operational circuit efficiency attention is also being turned to reducing static power loss, i.e. power loss due to currents occurring while a circuit is not performing operations. One solution to this issue is to simply turn off the supply to a portion of the design that is not currently being used. This serves to save static power, but there are significant dynamic power costs associated with restoring the state of the system when power is once again supplied to that portion of the design. Furthermore, there are additional drawbacks associated with a lag in response time associated with this restoration of state. This may not be acceptable in some systems.

To address these issues there are proposals for building retention flops to retain the state of the logic while a portion of it is powered down. Such a mode of operation allows the stored signal values to be securely held in a small portion of the circuitry whilst the remainder of the circuitry is powered down for power leakage reduction purposes. When power is resumed, the saved signal value is restored and operation continues.

However, much of the state of a system may typically be contained in other semiconductor memory devices such as SRAM array structures. These SRAM arrays due to their size contribute a large percentage of the total static power consumption in a typical SoC. Traditional techniques used to combat this static power consumption in the arrays result in significant performance hits to the read and write timing.

"A read-static-margin-free SRAM cell for low-Vdd and high-speed applications" by Takeda et al from ISSCC 2005, Session 26, static memory 26.3 pages 478 and 479 looks at improving data retention and increasing the speed of data access. It proposes the reduction of the voltage level supplied to a six transistor cell of the SRAM during write to ensure that the write signal is able to switch the state of the cell. It does not address the problem of reducing power consumption.

SUMMARY OF THE INVENTION

Viewed from one aspect the present invention provides a semiconductor memory storage device comprising: a data retention portion comprising latches; a peripheral portion comprising read and write logic; and a power switching device wherein said peripheral portion is operable to be powered by a periphery voltage difference; said data retention portion is operable to be powered by a data retention voltage difference said data retention voltage difference being different to said periphery voltage difference; and in response to a write request signal to write to at least one of said latches output from said peripheral portion to said data retention portion by said write logic, said power switching device is operable to reduce a voltage difference across said at least one of said latches such that a data signal output from said peripheral portion and having a voltage level determined by said periphery voltage difference is able to write to said at least one of said latches.

The present invention recognises the problem of power loss within SRAMS and provides a solution that has only a very low impact on the performance, area, and power of the array while still providing for a low leakage retention mode. It addresses the problem by providing two voltage domains, such that the retention portion is in one and all the rest of the periphery circuits are in another voltage domain. The periphery logic is then powered down during the retention state, while the retention portion retains power. The use of two voltage domains has the advantage that an appropriate voltage domain suitable for data retention and low static power loss can be applied to the data retention portion, while a different voltage domain appropriate to the logic within the peripheral portion can be applied to that portion of the circuit. A potential problem with two voltage domains is that it may be difficult for a signal from one voltage domain (the peripheral portion) to switch the state of a latch in a different voltage domain. However, this problem is addressed by reducing the voltage difference across the latch during the write procedure, such that a signal from the peripheral portion is able to switch the state of that latch.

In some embodiments said data retention voltage difference is greater than said periphery voltage difference.

Having a retention portion that operates in a higher voltage domain than the peripheral portion enables low leakage devices to be utilized to form the latches while retaining reasonable performance. Alternatively, the retention portion performance can be improved by using leakier devices for the latches and over-voltaging them. In any case, the ability to reduce the voltage across the latches during write enables the state to be switched by a voltage signal from a lower voltage domain. Thus, the advantages of a high voltage state within the data retention portion can be attained without the normal attendant disadvantages of difficulty in state switching.

Although the peripheral and data retention portions may have different low and/or high voltage levels, in preferred embodiments said peripheral portion and said data retention portion have a common low voltage supply level, said data retention having a higher high voltage supply level than said peripheral portion, said data signal having a voltage level that is less than or equal to said high voltage level of said peripheral portion.

In some embodiments, said peripheral portion is operable to generate a write assist signal and a data transfer enable signal in response to said write request signal, said write assist signal being generated during a time said data transfer enable signal is active, wherein said power switching device is operable to reduce a voltage difference across said at least one of said latches in response to detection of said write assist signal.

The reduction in the voltage level across the at least one latch can be controlled by a write assist signal which can be activated when it is desired to switch the state, i.e. write to the latch. It is desirable to control this signal to be active only during the time the data transfer enable signal is active and only for a short time, such that capacitively held state in any latch not being written to is not lost. This issue could be eliminated if the write assist signal were only used to turn off the supply to the target latches.

In some embodiments, each of said latches comprises a data port for inputting and outputting data, a data storage portion and a data transfer enable input device, said data transfer enable input device being operable to selectively isolate said data storage portion from said data port in response to one value of said data transfer enable signal received at said data transfer enable input device and to provide a low impedance path between said data port and said storage portion of said latch in response to a different value of said data transfer enable signal received at said data transfer enable input device.

In order to be able to write data to the device in some states and retain data in others, the device can be controlled using the data transfer enable signal such that the device that can selectively isolate the storage device from the data input in response to this signal.

In some embodiments, said latches are arranged in at least one group to form a word, said latches within said word being connected together by said data transfer enable inputs such that a data transfer enable signal is operable to be received at all of said data transfer enable inputs, said latches within said at least one group being each operable to provide a low impedance path between said data port and said data storage portion of said latch in response to said data transfer enable signal; and said power switching device is operable to reduce a voltage difference across said latches within said at least one group in response to said write assist signal.

In some embodiments, it is found to be advantageous to write to a plurality of latches that form a word at the same time. This provides access to a collection of data at one time rather than to a single bit. Furthermore, with this word based write assist signal, the write is controlled on a word basis, such that the latches not in the word that that aren't being written to aren't left to capacitively hold their state. This is advantageous as when a latch is capacitively holding state it is much more susceptible to lose state from a whole host of failure mechanisms.

In some embodiments, the semiconductor memory storage device comprises a plurality of groups of latches and a corresponding plurality of power switching devices.

In some embodiments, said power switching device comprises a transistor arranged between said latches and one of two voltage sources generating said data retention voltage difference.

A simple yet effective way of producing a temporary voltage reduction to enable state to be switched is by the provision of a transistor between the latches and voltage sources.

In some embodiments, said plurality of power switching means each comprise a transistor arranged between a group of said latches and their power supply.

In some embodiments said power switching device is operable to reduce a voltage difference across all of said latches in a group for a duration sufficiently short such that any latches not being written to do not lose data.

Although the reduction in the power across the latches is helpful in allowing the state to be switched, care should be taken that it is not done for too long or the capacitively stored data in latches not being switched may be lost.

In some embodiments, said semiconductor memory storage device further comprises a voltage level clamping device operable to clamp said data transfer enable input of said latches to a predetermined value, such that said data port of said latches is isolated from said data storage portion; wherein in response to a sleep mode signal said peripheral portion is operable to be powered down and said voltage level clamping device is operable to clamp said data transfer enable input of said plurality of latches to said predetermined value.

By clamping the data transfer enable input of the latches to a predetermined value the data port to the latches can be isolated and data can thus, be retained during low power mode.

In some embodiments, said latches are arranged in at least one group to form a word, said latches within said word being connected together such that a data transfer enable signal is operable to be received at all of said data transfer enable inputs within said word, said latches within said word being each operable to isolate said data port from said data storage portion of said latch in response to a predetermined value of said data transfer enable signal; and said semiconductor memory storage device further comprises a plurality of voltage level clamping devices each one operable to clamp a respective data transfer enable input to said predetermined value.

Rather than having a single clamping device for each latch it has been found advantageous to clamp all of the data transfer enable inputs of a word together. This reduces the number of clamping devices required. Furthermore, as in many embodiments the latches of a word are written to or read from together, their data transfer enable inputs must be of the same value.

In some embodiments said voltage clamping device comprises a NFET transistor.

An NFET transistor makes a simple yet effective clamping device.

In some embodiments, said semiconductor memory storage device comprises an SRAM, and each of said latches comprising a 6T cell.

SRAMs comprising 6T cells benefit from the arrangement of embodiments of the present invention.

A further aspect of the present invention provides a semiconductor means for storing data comprising: a means for retaining data comprising latching means; a peripheral means comprising means for reading data and means for writing data; and a power switching means for controlling power supplied to a portion of said means for storing data wherein said peripheral means is operable to be powered by a periphery voltage difference; said means for retaining data is operable to be powered by a data retention voltage difference said data retention voltage difference being different to said periphery voltage difference; and in response to a write request signal to write to at least one of said latching means output from said peripheral means to said means for retaining data by said write logic, said power switching means is operable to reduce a voltage difference across said at least one of said latching means such that a data signal output from said peripheral means and having a voltage level determined by said periphery voltage difference is able to write to said at least one of said latching means.

A yet further aspect of the present invention provides a method of storing data within a semiconductor memory comprising: supplying a periphery voltage difference to a peripheral portion comprising read and write logic of said semiconductor memory; supplying a data retention voltage difference that is different to said periphery voltage difference to a data retention portion comprising latches of said semiconductor memory; outputting a write request signal to write to at least one of said latches from said peripheral portion to said data retention portion; in response to said write request signal, reducing a voltage difference across said at least one of said latches; outputting a data signal having a voltage level determined by said periphery voltage difference from said peripheral portion; and writing to said at least one of said latches with said data signal.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
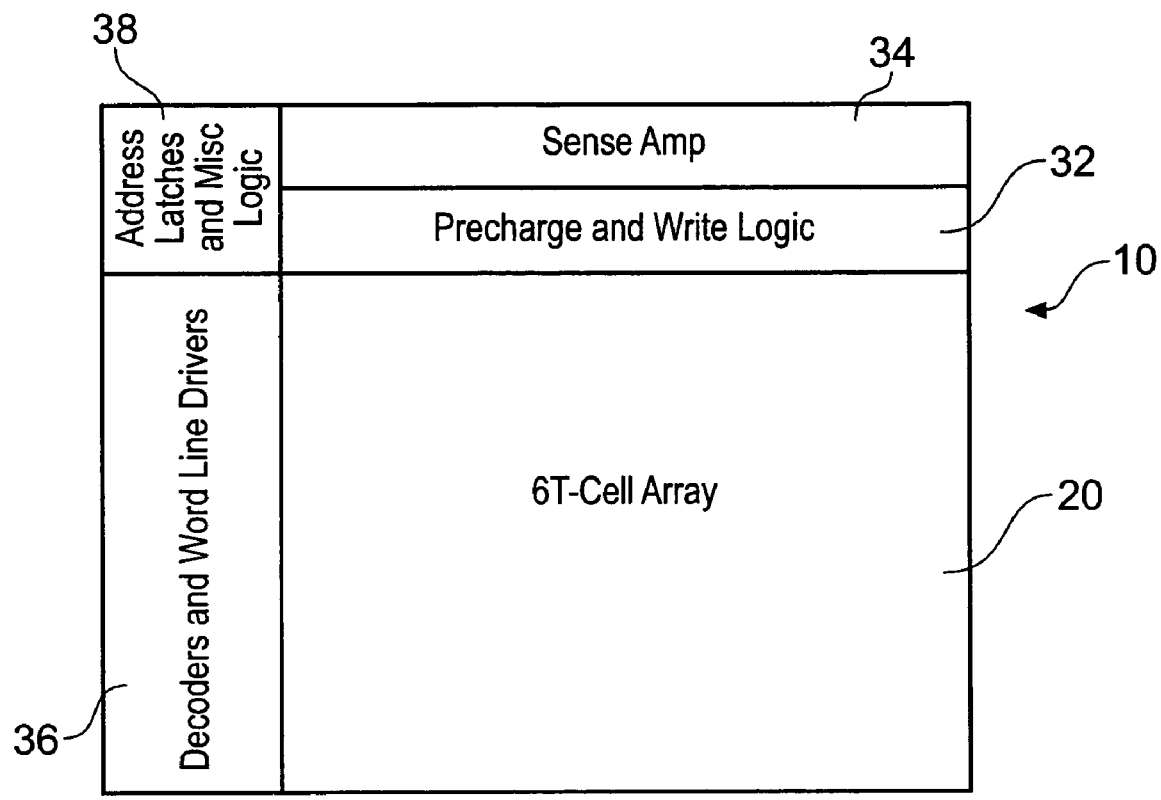
FIG. 1 shows a structural illustration of an SRAM.

FIG. 1 shows a simplified diagram of a SRAM 10. The SRAM 10 comprises a data retention portion 20, the data retention portion 20 comprising an array of 6T-cells. These are conventional data retention cells formed from six transistors (see FIG. 3). There is also a peripheral portion comprising precharge and write logic 32, sense amplifiers 34, decoders and word line drivers 36 and address latches and miscellaneous logic 38. SRAM circuits 10 are known and traditionally the entire circuit is in a single voltage domain. In embodiments of the invention, by contrast, the data retention portion 20 is formed in a different voltage domain to the peripheral portion.

In order to save power, the circuit may operate in a sleep mode, wherein during inactive periods, power can be reduced to portions of the circuit to reduce power consumption. To avoid a loss of state it is advantageous to retain power to the data retention portion 20, however the peripheral portions may be turned off. It is in sleep mode that the advantage of having the data retention portion 20 in a different voltage domain can be seen. This is because, as this portion is continuously powered, it is important in order to reduce static power loss to build as much of this portion as possible from low leakage devices. Having the data retention portion 20 in for example, a higher voltage domain helps in this respect. The higher voltage domain enables the data retention portion to be built from higher threshold, lower leakage devices while retaining reasonable performance. Alternatively, if performance is more important than reducing static power loss, array performance can be enhanced by using leakier devices for the 6T cells and over-voltaging them.

One problem with traditional SRAM arrays is that it can be difficult to switch the state of the 6T cells forming the data retention portion 20. Increasing the voltage level in the data retention portion compared to the peripheral data writing portion can exasperate this problem. One possible solution could be to provide level shifters between the peripheral portion and the data retention portion such that the voltage level of a write signal is amplified prior to reaching the data retention portion. A disadvantage of this is that it degrades the performance of the circuit. In embodiments of the present invention this problem is addressed by reducing the voltage across the 6T cells during a data write. This procedure is described below.

Figure 2:
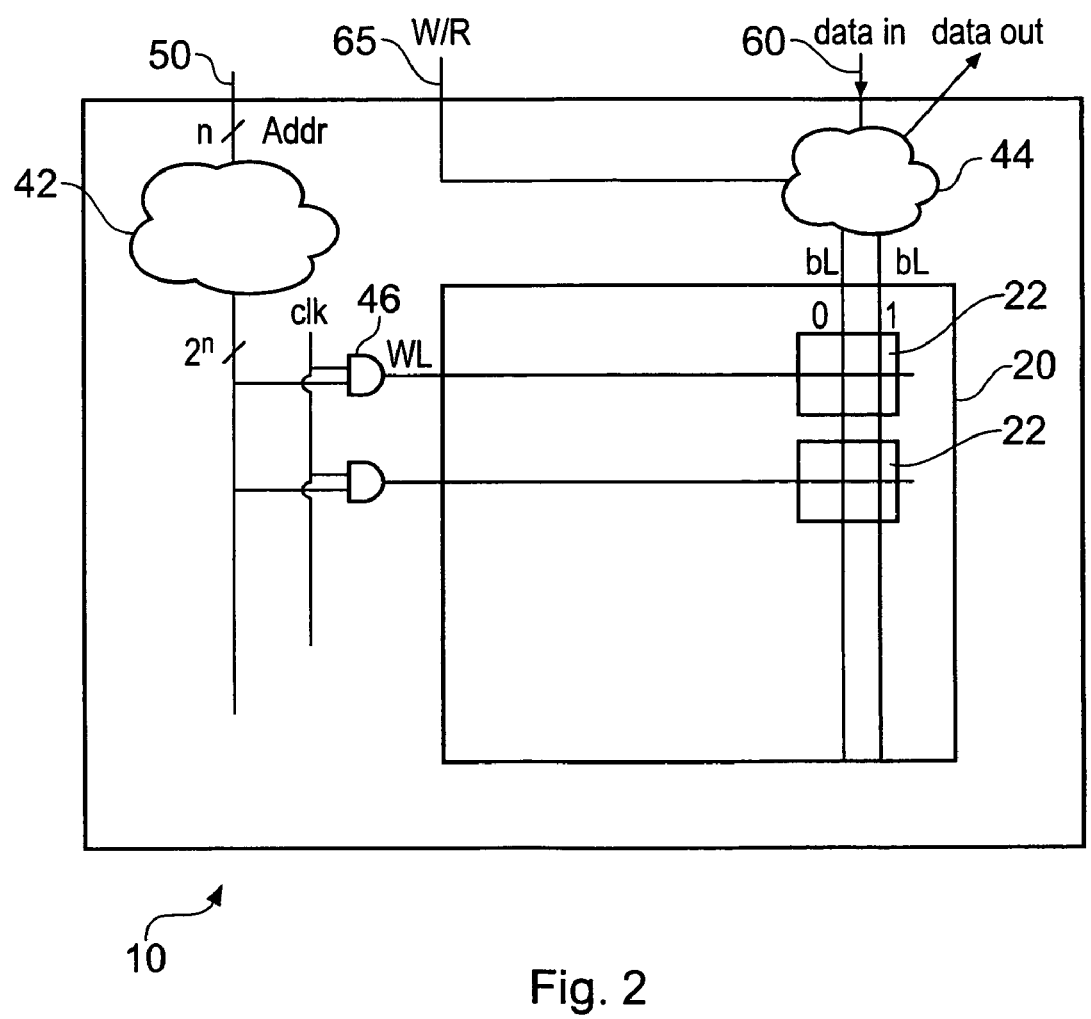
FIG. 2 shows the SRAM of FIG. 1 in more detail.

FIG. 2 shows the device of FIG. 1 in more detail. This device comprises a data retention portion 20 comprising an array of 6T cells 22. These are arranged in rows comprising a word which share a word line (w1), and in columns which share a pair of bit lines (b1). The cells are accessed in rows, i.e. as words, in response to an address which is input on bus 50 and decoded by decode logic 42. In response to a decoded address indicating that a particular word line is to be accessed, a control signal is sent to a particular AND gate 46. The AND gate outputs a data transfer enable signal (word line) which acts to switch devices which selectively isolate the latches from the data input/output of the device and cause them to provide a low impedance path between each latch 22 on the word line and the data input output (60) to the device (bit line pairs). This is described in more detail with respect to FIGS. 4 and 5. Once the latches 22 are no longer isolated from the data input/output ports 60, then data can be read from or written to the latches.

Figure 3:
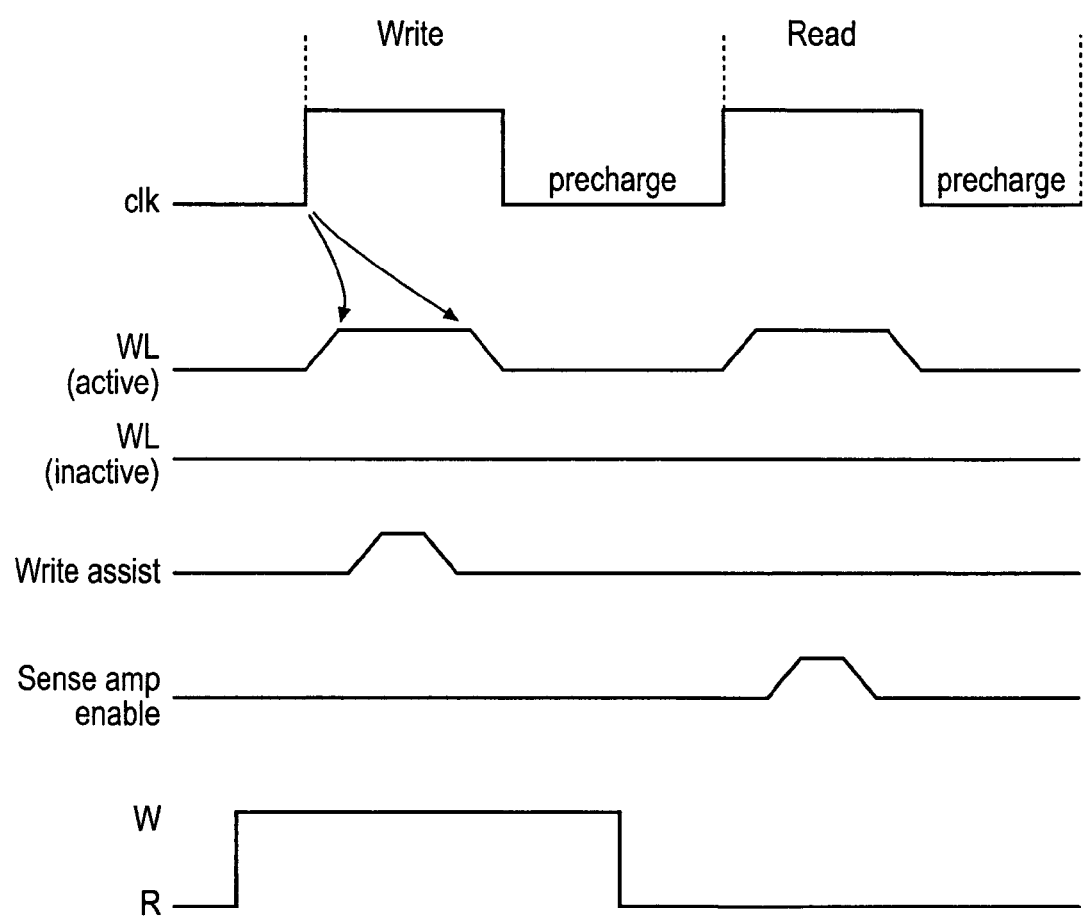
FIG. 3 shows a timing diagram of the operation of the SRAM of FIGS. 1 and 2.

In order to read from a latch, the bit line should be floating, the word line be active, and a sense amplifier needs to be enabled to detect the data held in the latch, thus, a sense enable signal is used that is timed with respect to the data transfer enable signal, this timing is shown in more detail with respect to FIG. 3.

In order to write to a latch, a write request signal is generated which translates to the word line being active and the bit line driven. A potential problem is that the data signal at input port 60 is from a lower voltage domain to that of the storage latch 22 that it is trying to overwrite. In order to ensure that the data is written correctly to the latch a write assist signal is used to reduce the voltage difference across the latch for a time sufficient to allow the latch to be overwritten. This write assist signal is input to a power transistor located between one of the voltage rails and the transistors in the latch and serves to temporarily cut power to the latch. This is shown in more detail in FIGS. 4 and 5.

FIG. 3 shows a timing diagram of how the clock signal and the other control signals operate to control both reading and writing to the 6T cell array 20.

The basic operation is on the rising edge of an input clock, and in response to this the decoded address, enable, read/write control, and input data bus are latched. The word lines selected in response to the decoded address signal goes high shortly after the clock rising edge and while the clock signal is high, the read or write is performed. Whether it is to be a read or write is determined from the read/write control signal.

If the read/write control signal 65 indicates a read is to be performed a single word line goes active as well as a matched dummy path. The word line going active, results in a row of 6T cells developing a small signal differential on their associated bit lines. A dummy path then generates a sense amp enable signal delayed such that sufficient bit line differential is present to reliably amplify the differential into a full rail signal. The dummy path can be delayed an additional amount of time after which it is used to pre-charge the array in preparation for the next clock edge. Alternatively, it is possible to use the clock as the control to precharge the bit-lines. This pre-charge operation typically deactivates the word lines, pre-charges the bit lines and sense amps, and latches the sense amp outputs. During read the bit lines are floating so that any signal generated on these lines can be read out. During write the bit lines are driven. From the 6T cells point of view, this is the only difference between a read and write operation in a traditional SRAM design.

When the read/write control signal indicates a write is to be performed a single word line goes active and the value latched from the input data bus is driven onto the bit lines based on the rising edge of the clock. This has the effect of setting the state of all the selected 6T cells to match the input data bus 60. The falling edge of the clock naturally turns off the word lines and the write drivers. The falling edge of the clock also activates the pre-charging of the bit-lines. As the peripheral logic holding the read/write logic 44 is in a different lower voltage domain to the 6T cell array, it is hard to flip the state of the 6T cells being written to. To address this problem, a power switch is introduced to the 6T cell array which has the ability in response to a write assist signal to disconnect either the VSS or VDD supply to the array. The read and write operation of the array remains unchanged except that during a write, power is severed to the 6T cells. This ensures that if the periphery were at a lower voltage the state of the 6T cells can still be over-written.

Thus, a dummy path is needed to turn off the VSS or VDD to the 6T cells long enough to ensure the state of the cells can be flipped if the periphery is at a lower voltage than the 6T array. This is required because the write margins are already very thin and a lower than full rail voltage from the bit cells point of view will not reliably flip the state of the bit cell. It is also important to note the power switch can not be off too long or the capacitively held state in the unwritten 6T cells will bleed off. In some embodiments, this problem is addressed by not turning power off to the whole array, but only to the row (word) of the array that is being written. Note that the relative timing of word-line and the power switch isn't critical. The only critical factors are the amount of time these signals are overlapped and that the power switch isn't left off too long in the case of the whole array being switched off.

If the voltage domains are the same or if the periphery domain is at a higher voltage the write margin will simply be improved using this technique. It should be noted that during write the sense amplifiers do not need to be enabled, thus, the sense enable signal is not used for a write, rather a write assist signal is used instead to cut the power to the 6T cell for the appropriate amount of time.

With regard to read, having the periphery domain at a lower voltage than the 6T array domain does not unduly affect it. The word-lines will not reach full rail from the 6T cell point of view, but as long as the voltage on the word line is sufficiently above the threshold voltage of the 6T cell pass gates a bit line differential will still begin to be generated. This will have the effect of degrading the rate of bit line development, but the rest of the read path timing to this point will be unaltered. Since the pre-charge logic is also in the lower voltage domain the bit lines will pre-charge to the lower VDD level. This should have no adverse effect on the 6T cell pulling one bit-line low while the other bit-line floats. If anything enough differential in the voltage domains could actually result in the floating bit-line being driven upward increasing the rate of bit-line differential development. Therefore, the rate of bit line development from the lower voltage word-line is the only negative impact on the read timing. Additionally, with the write margins being improved by the write assist logic the 6T cell design can be altered to favour the read timing more than is possible for 6T cells that don't have write assistance. This can more than compensate for the lower word line voltages impact on the rate of bit line differential.

If in an alternative embodiment the periphery domain is at a higher voltage than the 6T-cell domain then the word line driver will over-drive the pass transistors enhancing the rate of bit line development. The bit lines will be pre-charged higher than the VDD rail in the 6T cell, but the read operation will still function correctly as long as this increased voltage doesn't result in a read disturbance. This may require an alteration of the 6T cell design to insure safe operation under this set of voltage conditions. Once again though the write assist logic can allow the 6T cell to be better designed to cope with this circumstance and still enable safe write operation.

Figure 4:
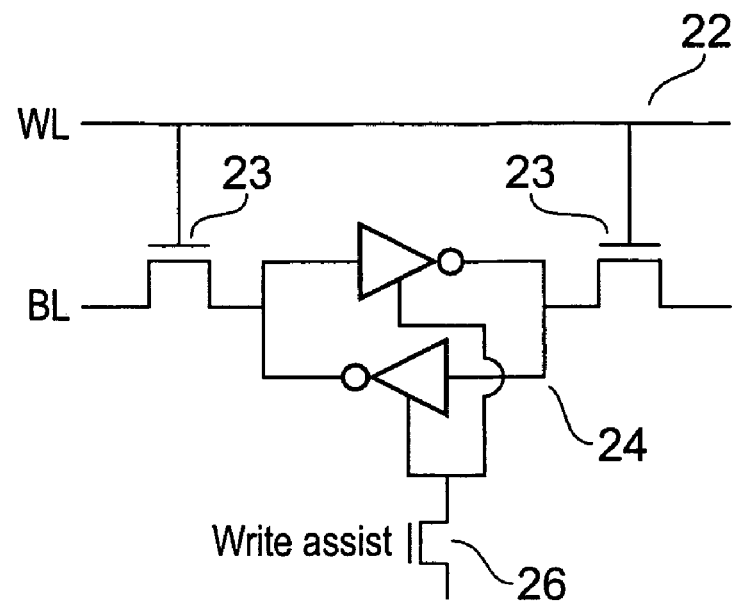
FIG. 4 shows a latch of an SRAM according to an embodiment of the invention.

FIG. 4 schematically shows a 6T cell 22 according to an embodiment of the present invention. The 6T cell comprises a latch portion 24 comprising two inverters arranged in a loop. A switching device, in this embodiment transistor 26 is coupled to these inverters to cut the power to them in response to the write assist signal and thereby enable them to be switched by a write signal having a lower voltage than the higher level of the voltage domain of the inverters. Transistors 23 act to selectively isolate the latch from the bit lines and therefore the data input/output ports. A data transfer enable signal on the word line can switch the transistors enabling data to be read into the latch or written from it.

Figure 5:
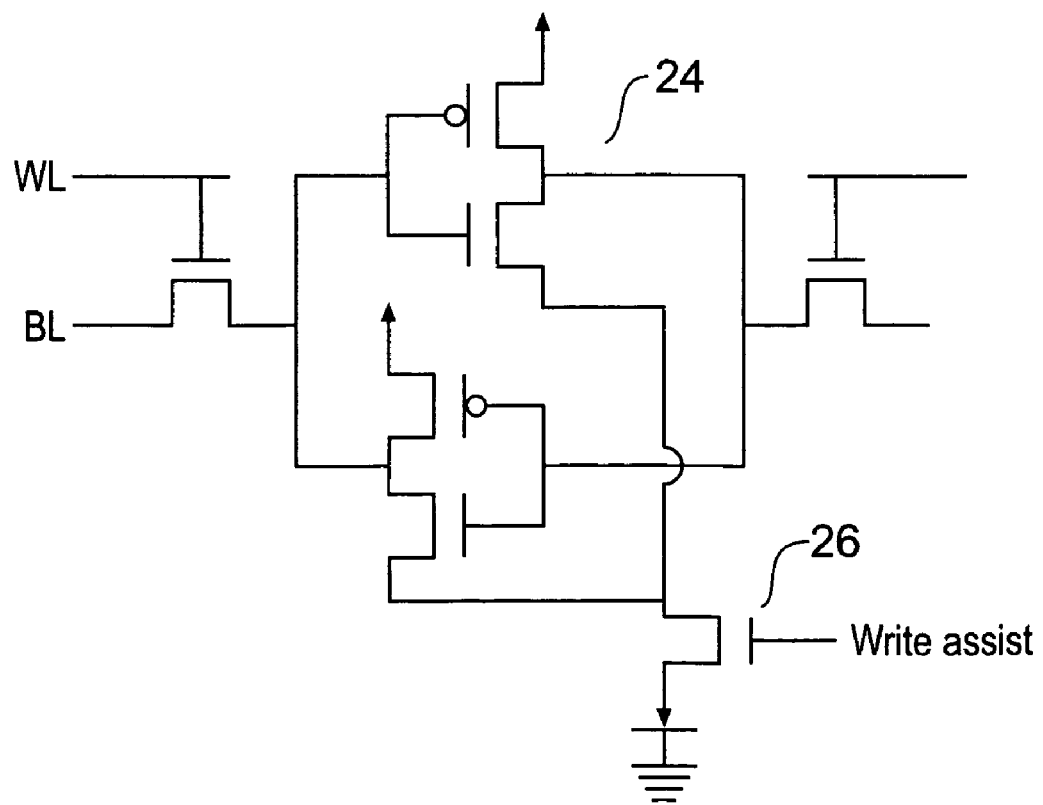
FIG. 5 shows the transistors within a latch of an SRAM according to an embodiment of the invention.

FIG. 5 shows the 6T cell 22 in transistor form. As can be seen a single extra transistor 26, in this embodiment an NFET transistor between the lower voltage rail Vss and the transistors of the latch can be used to temporarily cut the power supply to the latch thereby enabling it to switch state in response to a signal on its bit line BL. In alternative embodiments a PFET transistor could be placed between the high voltage rail Vdd and the transistors of the latch 24.

Although in FIGS. 4 and 5 a power switch transistor is shown for each cell, in embodiments of the invention there may be a single transistor for an array, or preferably one for each word line.

Figure 6:
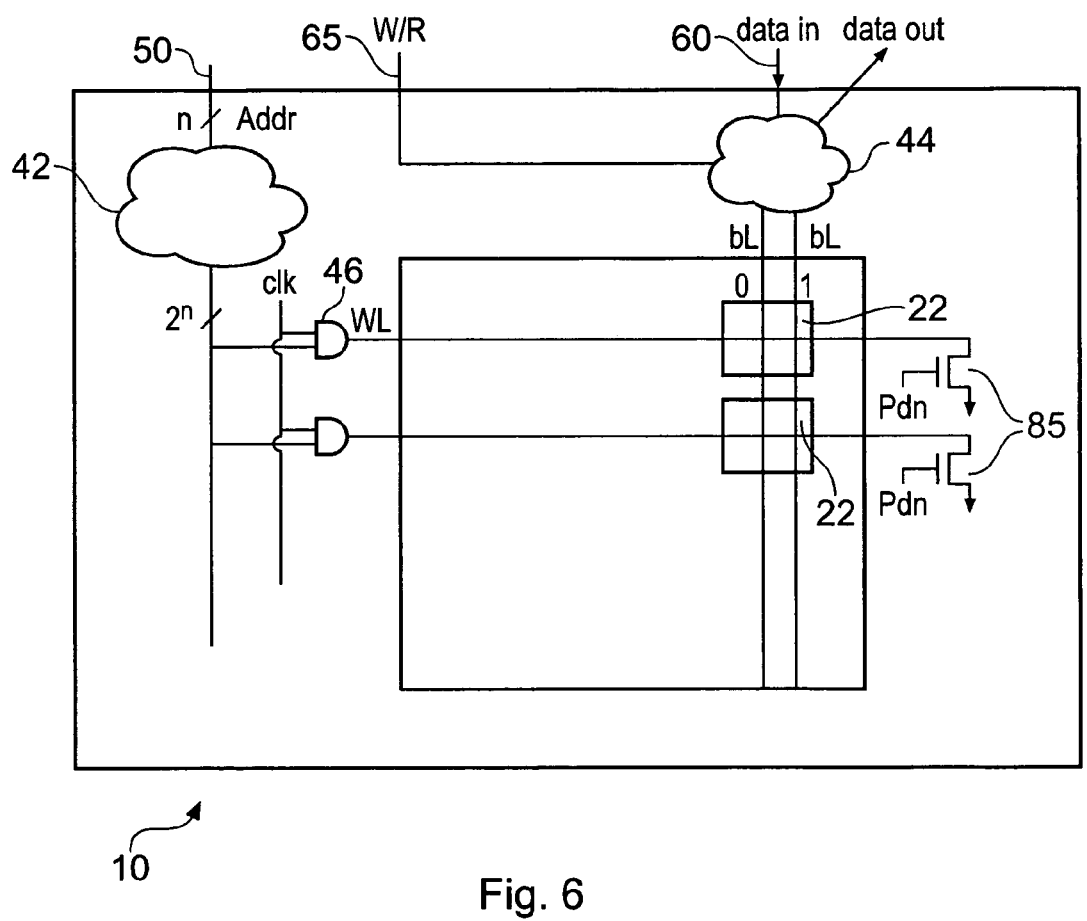
FIG. 6 shows an SRAM with a word line data transfer enable signal clamping device.

FIG. 6 shows a further embodiment of the invention, where static power consumption is addressed by supporting a sleep mode. This sleep mode is enabled by providing a clamping transistor 85 for each word line and the ability to power off the periphery logic. Embodiments of the invention are able to reduce the SRAM leakage of the 6T cells by allowing them to be formed from lower leakage transistors that are typically associated with high voltage supplies. Any leakage associated with the periphery is addressed by providing power switches to interrupt the supply to these typically much leakier devices. However, during data retention or sleep mode the word lines into the 6T cell arrays would now be floating. In functional (as opposed to sleep) mode the latches in a word line are written to or read from together and this is controlled by the data transfer enable signal, which allows the latches of the word line to be accessed via their bit lines, or to be isolated from them. During the data retention mode, the latches should be isolated to prevent or at least inhibit data leakage. Thus, a clamping transistor 85 can be used for each word line to hold the latches within that word line in their isolated states. Note that it isn't an issue if the bit-lines are allowed to float as long as the word lines are inactive. Embodiments of the invention address this problem by the addition of a single transistor 85, preferably an NFET device, to each word line. This transistor 85 should be the same type of device as those used to form the 6T cells and can be small in width as it only has to actively hold the word line low in the presence of no switching and minimal leakage. The drain is attached to the word line (w1), the gate to a retention or sleep signal (pdn), and the source to VSS. To ensure there is no DC path between this device and the word line driver a simple protocol can be adopted. If the clock to the SRAM is stopped inactive, then the word line is guaranteed to be inactive or become inactive shortly thereafter depending on the degree of self-timing used in the SRAM design. Thus, asserting the retention signal with the clock stopped low ensures no DC paths. Coming out of retention the power switch is turned on and then the retention signal turned off before any clocks are allowed to become active.

In summary the concept of embodiments of the invention is particularly useful for developing a low leakage retention RAM. In the case of having a RAM formed by a triple gate process then the 6T cells can be built using the higher voltage (thicker) with much lower leakage logic oxide. These devices are much slower for forming logical functions, but they result in 6T cells that aren't significantly slower in terms of developing an acceptable amount of bit line differential if used at their native voltage levels. In the case of devices not formed from triple gate oxide it is still possible to produce lower leakage SRAM's with very good performance by using the highest threshold devices available in the 6T cells and running these cells at a over-voltage relative to the rest of the design to maintain performance. Notice that in both of these cases the rest of the array is free to use more aggressive devices to maintain performance.

Clearly just moving to thicker oxide logic devices or high threshold voltage devices in the 6T cells will reduce the static power consumption of the array, while retaining state. State retention requires the 6T cells to always remain fully powered which is why it is important to reduce their leakage levels. A power switch for the periphery can be used to throttle the leakage of the periphery to that of the power switch. This device can be integrated into the SRAM or it can be external such that the SRAM periphery is on a shared switched supply with the rest of the design. Alternatively, the power switch can be moved external to the entire chip if the domain is being controlled by an off chip voltage regulator.

In summary an SRAM that has reasonably high performance in the presence of the periphery being in one voltage domain while the 6T cell array is in another is provided. These separate domains allow for a very low leakage retention state to be created with very little additional logic. As long as static power remains a concern, this feature should prove to be very valuable.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A semiconductor memory storage device comprising:
   a data retention portion comprising latches;
   a peripheral portion comprising read and write logic; and
   a power switching device wherein
   said peripheral portion is operable to be powered by a periphery voltage difference;
   said data retention portion is operable to be powered by a data retention voltage difference, said data retention voltage difference being different to said periphery voltage difference; and
   in response to a write request signal to write to at least one of said latches, output from said peripheral portion to said data retention portion by said write logic, said power switching device is operable to reduce a voltage difference across said at least one of said latches such that a data signal output from said peripheral portion having a voltage level determined by said periphery voltage difference is able to write to said at least one of said latches.

2. A semiconductor memory storage device according to claim 1, wherein said data retention voltage difference is greater than said periphery voltage difference.

3. A semiconductor memory storage device according to claim 2, wherein said peripheral portion and said data retention portion have a common low voltage supply level, said data retention having a higher high voltage supply level than said peripheral portion, said data signal having a voltage level that is less than or equal to said high voltage level of said peripheral portion.

4. A semiconductor memory storage device according to claim 1, wherein said peripheral portion is operable to generate a write assist signal and a data transfer enable signal in response to said write request signal, said write assist signal being generated during a time said data transfer enable signal is active, wherein said power switching device is operable to reduce a voltage difference across said at least one of said latches in response to detection of said write assist signal.

5. A semiconductor memory storage device according to claim 4, wherein
   each of said latches comprises a data port for inputting and outputting data, a data storage portion and a data transfer enable input device, said data transfer enable input device being operable to selectively isolate said data storage portion from said data port in response to one value of said data transfer enable signal received at said data transfer enable input device and to provide a low impedance path between said data port and said storage portion of said latch in response to a different value of said data transfer enable signal received at said data transfer enable input device.

6. A semiconductor memory storage device according to claim 5, wherein
   said latches are arranged in at least one group to form a word, said latches within said word being connected together such that a data transfer enable signal is operable to be received at all of said data transfer enable inputs, said latches within said at least one group being each operable to provide a low impedance path between said data ports and said data storage portion of said latch in response to said data transfer enable signal; and
   said power switching device is operable to reduce a voltage difference across said latches within said at least one group in response to said write assist signal.

7. A semiconductor memory storage device according to claim 6, comprising a plurality of groups of latches and a corresponding plurality of power switching devices.

8. A semiconductor memory storage device according to claim 7, wherein said plurality of power switching means each comprise a transistor arranged between a group of said latches and their power supply.

9. A semiconductor memory storage device according to claim 5, wherein
   said semiconductor memory storage device further comprises a voltage level clamping device operable to clamp said data transfer enable input of said latches to a predetermined value, such that said data port of said latches is isolated from said data storage portion; wherein
   in response to a sleep mode signal said peripheral portion is operable to be powered down and said voltage level clamping device is operable to clamp said data transfer enable input of said plurality of latches to said predetermined value.

10. A semiconductor memory storage device according to claim 9, wherein said latches are arranged in at least one group to form a word, said latches within said word being connected together such that a data transfer enable signal is operable to be received at all of said data transfer enable inputs within said word, said latches within said word being each operable to isolate said data port from said data storage portion of said latch in response to a predetermined value of said data transfer enable signal; and said semiconductor memory storage device further comprises a plurality of voltage level clamping devices each one operable to clamp a respective data transfer enable input to said predetermined value.

11. A semiconductor memory storage device according to claim 9, wherein said voltage clamping device comprises a NFET transistor.

12. A semiconductor memory storage device according to claim 1, wherein said power switching device comprises a transistor arranged between said latches and one of two voltage sources generating said data retention voltage difference.

13. A semiconductor memory storage device according to claim 1, wherein said power switching device is operable to reduce a voltage difference across all of said latches for a duration sufficiently short such that any latches not being written to do not lose data.

14. A semiconductor memory storage device according to claim 1, said semiconductor memory storage device comprising an SRAM, and each of said latches comprising a 6T cell.

15. A semiconductor means for storing data comprising:
a means for retaining data comprising latching means;
a peripheral means comprising means for reading data and means for writing data; and
a power switching means for controlling power supplied to a portion of said means for storing data wherein said peripheral means is operable to be powered by a periphery voltage difference;

said means for retaining data is operable to be powered by a data retention voltage difference, said data retention voltage difference being different to said periphery voltage difference; and in response to a write request signal to write to at least one of said latching means, output from said peripheral means to said means for retaining data by said write logic, said power switching means is operable to reduce a voltage difference across said at least one of said latching means such that a data signal output from said peripheral means having a voltage level determined by said periphery voltage difference is able to write to said at least one of said latching means.

16. A method of storing data within a semiconductor memory comprising:

supplying a periphery voltage difference to a peripheral portion comprising read and write logic of said semiconductor memory;

supplying a data retention voltage difference that is different to said periphery voltage difference to a data retention portion comprising latches of said semiconductor memory;

outputting a write request signal to write to at least one of said latches from said peripheral portion to said data retention portion;

in response to said write request signal, reducing a voltage difference across said at least one of said latches;

outputting a data signal having a voltage level determined by said periphery voltage difference from said peripheral portion; and writing to said at least one of said latches with said data signal.

* * * * *